(12) United States Patent
Wang et al.

(10) Patent No.: US 8,069,424 B2
(45) Date of Patent: Nov. 29, 2011

(54) GENERATING A BASE CURVE DATABASE TO REDUCE STORAGE COST

(75) Inventors: Xin Wang, Pasadena, CA (US); Harold J. Levy, Los Gatos, CA (US); Michael N. Misheloff, Dublin, CA (US)

(73) Assignee: Synopsys, Inc., Mountain View, CA (US)

( * ) Notice: Subject to any disclaimer, the term of this patent is extended or adjusted under 35 U.S.C. 154(b) by 339 days.

(21) Appl. No.: 12/212,606

(22) Filed: Sep. 17, 2008

(65) Prior Publication Data

US 2009/0013291 A1 Jan. 8, 2009

Related U.S. Application Data

(62) Division of application No. 11/245,550, filed on Oct. 6, 2005, now Pat. No. 7,444,605.

(51) Int. Cl.
*G06F 17/50* (2006.01)

(52) U.S. Cl. ......... 716/100; 716/103; 716/106; 716/132

(58) Field of Classification Search .......... 716/100–103, 716/106–110, 132–135
See application file for complete search history.

(56) References Cited

U.S. PATENT DOCUMENTS

| | | |
|---|---|---|
| 5,655,109 A | 8/1997 | Hamid |
| 6,028,995 A | 2/2000 | Jetton et al. |
| 6,516,454 B1 | 2/2003 | Hirata et al. |
| 6,622,291 B1 | 9/2003 | Ginetti |
| 2001/0000212 A1* | 4/2001 | Reipur et al. ............... 320/104 |

\* cited by examiner

*Primary Examiner* — Paul Dinh
(74) *Attorney, Agent, or Firm* — Bever, Hoffman & Harms, LLP; Jeanette S. Harms

(57) ABSTRACT

An enhanced library accessible by an EDA tool can include a base curve database and a plurality of curve data sets. Each curve data set refers to a standard cell having certain timing characteristics. To determine those timing characteristics, each curve data set identifies at least one base curve (in the base curve database) as well as a starting current, a peak current, a peak voltage, and a peak time. In one embodiment, each base curve can be normalized. The base curve(s), the starting current, peak current, peak voltage, and peak time can accurately model the functioning of the IC device, e.g. represented by an I(V) curve.

10 Claims, 6 Drawing Sheets

213

| Inverter cell rise I(t) curve #1 | |
|---|---|
| Time | Current |
| 3.00 | 0.01 |
| 3.10 | 0.05 |
| 3.20 | 0.10 |
| 3.35 | 0.20 |
| 3.40 | 0.30 |
| 3.45 | 0.25 |
| 3.50 | 0.20 |
| 3.60 | 0.15 |
| 3.70 | 0.05 |
| 3.90 | 0.01 |
| 3.80 | 0.02 |
| 3.90 | 0.00 |
| 3.70 | 0.01 |

Figure 2E

GENERATING A BASE CURVE DATABASE TO REDUCE STORAGE COST

RELATED APPLICATIONS

This application is a divisional of U.S. patent application Ser. No. 11/245,550, entitled "Generating A Base Curve Database To Reduce Storage Cost" filed Oct. 6, 2005.

BACKGROUND OF THE INVENTION

1. Field of the Invention

The present invention relates to the storage of curves associated with integrated circuit device functions and in particular to generating a base curve database to reduce storage cost.

2. Related Art

FIG. 1 illustrates a simplified representation of an exemplary digital integrated circuit design flow 100. At a high level, the process starts with the product idea in step 101. In designing an integrated circuit (IC), engineers typically rely upon computer-implemented tools to help create a circuit schematic design consisting of individual devices coupled together to perform a certain function. In one embodiment, these computer-implemented tools include EDA software 102, which can translate the circuit into a physical representation, i.e. a layout. When the layout is finalized, it can be used during tape-out 103. After tape out, fabrication 104 as well as packaging and assembly 105 can proceed to produce the integrated circuit (IC) 106, also called a chip.

Note that EDA software (also called EDA tools) 102 can perform a plurality of steps 110-119, which are shown in linear fashion for simplicity in FIG. 1. In an actual IC design process, various steps may be repeated until certain tests are passed. Moreover, these steps may occur in different orders and combinations. Therefore, these steps are described below for context and general explanation rather than as a specific, or recommended, design flow for a particular IC.

In step 110, engineers can describe the functionality that they want to implement in a system design, perform what-if planning to refine that functionality, and check the costs associated with the system design. Hardware-software architecture partitioning can occur in this step. Exemplary EDA software products from Synopsys, Inc. that can be used at this step include Model Architect, Saber, System Studio, and DesignWare® products.

In step 111, the VHDL or Verilog code for modules in the system design, i.e. the logic design, can be written and then verified for functional accuracy (e.g. checked to ensure that the logic design produces the correct outputs). Exemplary EDA software products from Synopsys, Inc. that can be used in step 111 include VCS, VERA, DesignWare®, Magellan, Formality, ESP and LEDA products.

In synthesis and design for test step 112, the VHDL/Verilog code can be translated to a netlist. This netlist can then be optimized for the target technology. Additionally, tests for checking the finished IC can be designed and implemented. Exemplary EDA software products from Synopsys, Inc. that can be used at this step include Design Compiler®, Physical Compiler, Test Compiler, Power Compiler, FPGA Compiler, Tetramax, and DesignWare® products.

In netlist verification step 113, the netlist can be checked for compliance with timing constraints and for correspondence with the VHDL/Verilog code. Exemplary EDA software products from Synopsys, Inc. that can be used at this step include Formality, PrimeTime, and VCS products.

In design planning step 114, an overall floorplan for the chip is constructed and analyzed for timing and top-level routing. Exemplary EDA software products from Synopsys, Inc. that can be used at this step include Astro and IC Compiler products.

In physical implementation step 115, the circuit elements of the logic design can be positioned and connected (generally called "place and route"). Exemplary EDA software products from Synopsys, Inc. that can be used in step 115 include the Astro and IC Compiler products.

In analysis and extraction step 116, the circuit function can be verified at a transistor level, thereby permitting what-if refinement. Exemplary EDA software products from Synopsys, Inc. that can be used in step 116 include AstroRail, PrimeRail, Primetime, and Star RC/XT products.

In physical verification step 117, various checking functions can be performed to ensure correctness for manufacturing, electrical issues, lithographic issues, and circuitry. Exemplary EDA software products from Synopsys, Inc. that can be used in step 117 include the Hercules product.

In resolution enhancement step 118, the layout can be manipulated to improve manufacturability of the design. Exemplary EDA software products from Synopsys, Inc. that can be used in step 118 include Proteus, ProteusAF, and PSMGen products.

In mask data preparation step 119, the "tape-out" data for production of masks for lithographic use can be generated. Exemplary EDA software products from Synopsys, Inc. that can be used in step 119 include the CATS® family of products.

Various steps described above, e.g. steps 112-116, require access to a standard cell library that includes standard cells (hereinafter called cells) as well as a database that stores certain integrated circuit (IC) information associated with those cells. This standard cell library can include thousands of cells usable in implementing an IC design. Exemplary standard cells could include flip-flops, logic gates, adders, or other IC devices commonly used in an IC design. Exemplary IC information can include cell pin capacitance, cell output delay, cell output slew, and cell output current.

FIG. 2A illustrates an exemplary standard cell 200, i.e. an inverter 201 having an output node coupled to ground via a capacitor 202, that could be characterized. The standard cell design and cell behavior information are stored in a standard cell library. Note that capacitor 202 can represent an output node capacitance of inverter 201 and/or capacitance of an exemplary wire connecting to another device. Thus, capacitor 202 can generically represent the load associated with inverter 201.

The standard cell library can include cell behavior information due to different loads. For example, if a cell is to be located a relatively long distance from its connecting device, then the effective load capacitance is large, and the standard cell library should have information related to the behavior of this cell with a large load. In reality, the relatively large capacitance can be due to the long wire that is needed (or at least anticipated) to connect to another device. A timing analyzer of the EDA tools will need this load information as input for timing analysis.

Additionally, a standard cell library can include standard cells behaviors due to different input slew rates. In general, an input signal provided to a device can affect its output signal. For example, referring to inverter 201, input signal 203 transitions from a logic high state to a logic low state, which generates an output signal 204 that transitions from a logic low state to a logic high state. The time a signal takes to transition from one logic state to another logic state is called transition time; and slew is the inverse of the transition time. Logically, the input slew can affect the output slew. In addition, input slew also affects other cell behavior/response such as the cell delay, which is defined as the time delay for the output signal to reach a certain voltage level after the input signal reaches a certain voltage level. This voltage level can be predefined, i.e. 50% of a power supply voltage.

Of importance, the timing constraints associated with a particular IC design may require selecting one cell rather than another cell to ensure system functionality. Therefore, the cell library must be able to generate a timing model for each cell. In a conventional standard cell library, a non-linear delay model (NLDM) is usually provided. In an NLDM library, the cell behaviors (such as delay and output slew) are modeled by lookup tables. The lookup tables usually use capacitance, input slew and etc., as indexes. Using these indexes, the lookup tables can be accessed and the delay/output slew associated with that cell can be determined using interpolation and extrapolation. Usually, interpolation accuracy is affected by the number and the positions of the index points. More points for each index and larger tables are needed to achieve high accuracy.

Note that a timing model is typically provided for each transition of a cell. That is, although one arc can be used for an inverter cell rise transition, a multi-input logic gate (e.g. a NAND gate) may use N arcs, wherein N is the number of cell transitions due to different inputs. An arc is the transition model of a cell due to different input slew and load capacitance. In the case of an NLDM model that supplies cell output slew and delay to the timing analyzer, each arc of a regular cell includes a cell output slew and a cell output delay lookup table. Further note that timing models can be provided for both rising and falling edges. Specifically, a device may have a different delay associated with receiving a falling edge (see, for example, input signal 203) versus receiving a rising edge. Typically, a standard cell library includes cell behavior information associated with both rising and falling edges.

Unfortunately, with the continuous down-sizing of semiconductor transistors, calculating cell delays and output slews using lookup tables providing cell output delay and output slew is becoming increasingly inadequate. Specifically, transistor behaviors are becoming more nonlinear and cell driving behaviors become too complex to model with just output slew and delay, thereby rendering the NLDM model inaccurate. To provide greater accuracy, another type of timing model that characterizes cell parameters over time was developed. This type of model is often known as the current-source models.

For example, referring to FIG. 2A, transitioning input signal 203 provided to the input terminal of inverter 201 results in certain cell responses, e.g. output currents and voltages over time. FIG. 2B illustrates an exemplary graph 210 showing the output current of device 200 over time, i.e. an I(t) curve. FIG. 2C illustrates a corresponding graph 211 showing the output voltage over time, i.e. a V(t) curve. FIG. 2D illustrates a corresponding graph 212 showing the output current versus the voltage, i.e. an I(V) curve. Because these curves can provide voltage and/or current information for the entire transition period, this type of timing model enables significantly more accurate timing analysis than the traditional NLDM timing model that only provides output delay and slew information for each transition.

Note that because of the known relationship between the I(t), V(t), and I(V) curves (i.e. I=C (dV/dt)), one curve may be converted to other curves. However, because the timing analysis methodology may work better with a certain type of curve, and because there is usually an accuracy lose in curve conversion, one type of curve may provide better timing analysis performance than the others. Therefore, different EDA vendors provide different timing models based on different curves. For example, Synopsys, Inc. provides a Composite Current Source (CCS) timing model based on I(t) curves. Cadence Design Systems provides an Effective Current Source Model (ECSM) based on V(t) curves.

To store an I(t), V(t), or I(V) curve, values associated with fixed sampled or adaptively sampled points on the curve can be placed in a database. A typical database may need 10-20 floating point numbers to represent a curve. For example, the I(t) curve of FIG. 2B can be represented using 9 adaptively sampled points (each point shown as a "*"), thereby requiring 9 time values and their corresponding current values (9+9=18). Other databases could include fewer or more floating point numbers to represent a curve. For each cell timing arc, multiple curves are needed for different input slew and load capacitance indices. For example, if 10 slew and 10 load indices are used, then the cell timing arc has 10×10=100 curves. Multiple arcs are also needed to model different type of cell transitions. To give an example, a standard cell library may have 1000 cells and each cell could have up to 10 or more transitions.

To facilitate designing current ICs and taking into account different input slews, load capacitances, as well as different cell transitions and different cells, a curve library might need to store up to 1 million or more curves. FIG. 2E illustrates an exemplary CCS library 213 including a plurality of curves stored as vectors. These curves may occupy more than 90% of the storage space of the library. Moreover, varying fabrication processes or temperatures may require multiple (5-20) libraries to be provided, thereby significantly increasing the size of an already large storage space. Moreover, EDA tools waste valuable memory and CPU time when loading large libraries.

Therefore, a need arises for providing accurate timing models for standard cells, as well as reducing the storage cost of storing curves in the standard cell library so that library storage space and EDA tool memory usage for loading the library can be substantially reduced.

SUMMARY OF THE INVENTION

The goal of electronic design automation (EDA) is to progress as quickly and as efficiently as possible from a circuit schematic design to a layout. In many designs, the timing of its constituent devices can be critical. To provide critical timing characteristics and other design characteristics, EDA tools use a standard cell library. Each cell in the standard cell library represents a particular integrated circuit device and its corresponding characteristics.

Some standard cell library using a current-source-based timing model, e.g. a CCS or ECSM (or other model), may require storing curves in the library. Sometimes up to 1 million or more curves are stored directly as vectors in the library to provide accurate timing information for its cells. Unfortunately, these curves require significant storage space, which undesirably increases the library size. Moreover, an EDA tool can waste considerable amount of memory and CPU time in loading very large libraries.

In accordance with one aspect of the invention, an enhanced library accessible by an electronic design automation (EDA) tool is described. This library can include a base curve database and a plurality of curve data sets. Each curve data set describes a curve of a cell transition at different input slew and load capacitance. To describe the shape of the curve (I(V), V(t), I(t) curves and etc.) efficiently, each curve data set identifies one or more base curves in the base curve database. Notably, each base curve in the base curve database may be normalized to make modeling multiple curves convenient.

Each curve data set can further include critical curve parameters (time, current, voltage, etc.) to describe the characteristics of the cell transition curve. The base curves, together with the critical curve parameters can accurately model the transition curve of a standard cell at certain input slew and load capacitance. In one embodiment, the cell transition behavior at certain input slew and load capacitance is represented by an I(V) curve. In one embodiment, two base curves corresponding to the left-half and right-half of the I(V) curve, a starting current, a peak current, a peak voltage, and a peak time are used to describe this I(V) curve. Note only two integer base curve identifications and four floating point numbers are needed, thereby significantly reducing storage requirements compared to storing 9 current points (i.e. 18 floating point numbers).

In the above embodiment, the base curves in the base curve database are usually normalized so that they can be conveniently applied to model multiple I(V) curves. The base curves can be linearly scaled using the starting current, the peak current, the peak voltage, and the peak time to accurately reconstruct that I(V) curve.

A base curve database accessible by an electronic design automation (EDA) library is also described. This base curve database includes a plurality of curves that may be normalized, wherein each normalized curve can be represented by a plurality of values associated with standardized locations on an axis. In one embodiment, each normalized curve can represent a left half curve or a right half curve, wherein a composite left half curve and right half curve can facilitate forming a function curve for a standard cell.

A method of creating and using a base curve database for an EDA library is also described. This method starts from an existing or empty base curve database. Each function curve can be segmented as necessary (i.e. the function curve can be segmented into one or more curves). In one embodiment, each resulting curve can be normalized to generate a normalized curve. If no base curve in the database can accurately match the normalized curve to satisfy a certain tolerance requirement, then the normalized curve can be added to the database as a base curve. An example of tolerance is that relative tolerance equals 1%. On the other hand, if a base curve in the database matches the normalized curve, then that base curve can be used to model the function curve.

A method of converting a first library that represents a plurality of curves directly using vectors into a second library that represents the curve by using a base curve database is also described. In this method, a curve (i.e. a function curve or each segment of that function curve) is first normalized. If no base curve in the base curve database of the second library matches the normalized curve, that normalized curve can be added to the base curve database of the second library. In one embodiment, a curve in the first library can be split at its peak into two half curves and each half can then be normalized. If no base curve in the second library matches a normalized half curve, then that normalized half curve can be added to the second library as a base curve.

An EDA tool is also described. This EDA tool loads a library having a plurality of standard cells and a base curve database. Notably, each standard cell identifies base curves in the base curve database to model its transition. Each standard cell transition curve modeling can further include critical time, current, and voltage parameters as curve characteristic parameters, e.g. a starting current, a peak current, a peak voltage, and a peak time.

A method of reconstructing a function curve using a base curve database is also described. At this point, the base curve database has already been successfully constructed and the base curve identification used in modeling has corresponding base curves in the base curve database. The base curves associated with the base curve identifications of a curve set are first identified. Then, the base curves are linearly scaled using the curve characteristic parameters and combined to construct one function curve.

In one embodiment, the function curve is modeled using two base curves. The two base curves are first identified using the curve identifications. The function curve can then be reconstructed using the curve characteristic parameters, e.g. a starting current, a peak current, a peak voltage, and a peak time as well as the first and second normalized base curves.

Because each base curve in the shared base curve database can be used to model multiple transition/function curves, the number of base curves is usually far less than the number of function curves in the library. For example, instead of requiring 1-4 million curves in a typical CCS library, the enhanced standard cell library may only need 10,000-100,000 base curves. Therefore, the storage cost of a base curve database is almost negligible.

With the base curve database, each function curve can be efficiently modeled with one or more base curve identifications and a few critical parameters. This efficient modeling can provide a dramatic storage cost reduction compared with directly storing each function curve as a vector that would require 10-20 floating point numbers. Thus, the sharing of base curves as facilitated by the base curve database, and using base curves to describe the shape of the function curves can significantly reduce the storage space of function curves by 3-5×. When applied to current-source-model-based standard cell library, using a base curve database can advantageously reduce the size of the library by 3-5×. Moreover, a small base curve database and thus a small library means that the EDA tool can load that library faster with less memory usage, thereby advantageously reducing the memory and CPU time usage of the EDA tool. Of importance, once created, a base curve database can be shared by a plurality of libraries, thereby further increasing its effectiveness.

BRIEF DESCRIPTION OF THE FIGURES

FIG. 2E illustrates an exemplary CCS library including a plurality of function curves stored as vectors.

DETAILED DESCRIPTION OF THE FIGURES

An enhanced standard cell library can include a base curve database, which can ensure accuracy of function curve modeling while minimizing storage space. In general, an I(t), V(t), I(V) curve, or other function curve can be modeled with one more base curves. For illustration purposes, an I(V) curve modeled by two base curves is now described.

Figure 3A:
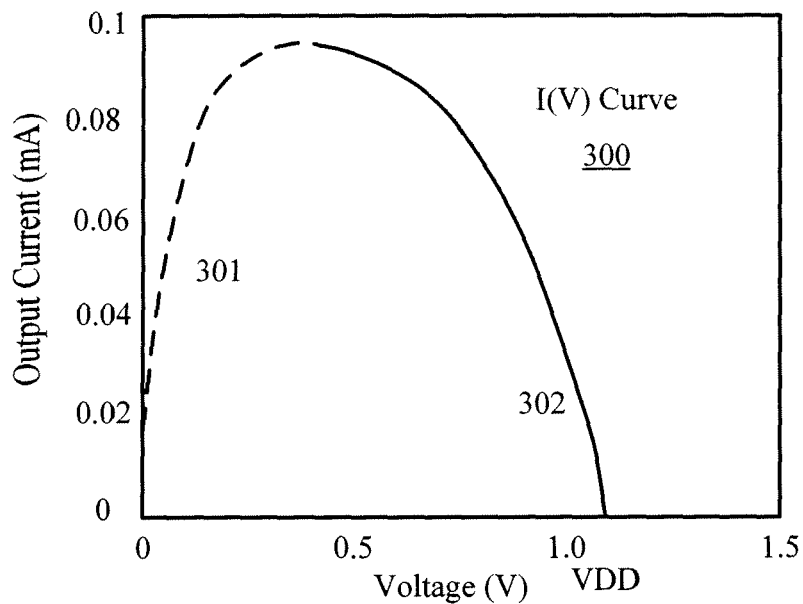
FIG. 3A illustrates splitting a curve at its peak to allow characterizing that half-curve.

FIG. 3A illustrates an I(V) curve 300 that at its peak is divided into a left half curve 301 and a right half curve 302. Note that the term "half" refers to one of two portions of the curve and does not necessarily mean that these two portions are similarly apportioned. The shape of a half curve can be accurately represented by a base curve, which may be normalized so that its height and width equal one.

Figure 3B:
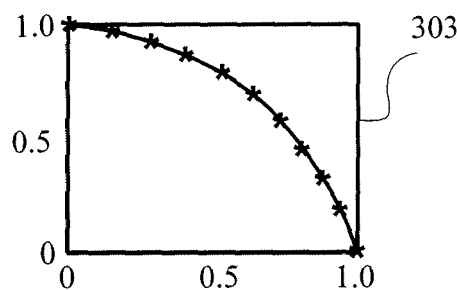
FIG. 3B illustrates a normalized curve based on the right half-curve of FIG. 3A.

FIG. 3B illustrates a normalized curve 303 that represents right half curve 302 (FIG. 3A). In one embodiment, normalized curve 303 can include 11 points plotted at predetermined intervals (e.g. 0, 0.1, 0.2, etc.) along the x axis. Other embodiments can include more or fewer points. Typically, for the above described I(t), V(t), and I(V) curves, 10-15 standardized points of reference for a half curve can ensure reconstruction accuracy.

Figure 3C:
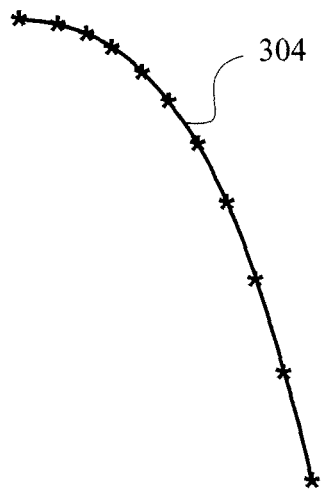
FIG. 3C illustrates reconstructing the right half-curve of FIG. 3A using the normalized (base) curve of FIG. 3B and linear scaling.

FIG. 3C illustrates a reconstructed half curve 304 that is generated using normalized curve 303 (FIG. 3B) and linear scaling. Notably, reconstructed half curve 304 is substantially identical to half curve 302. To reconstruct an I(V) curve of the cell transition, both a left base curve and a right base curve are linearly scaled and then connected.

Figure 3D:
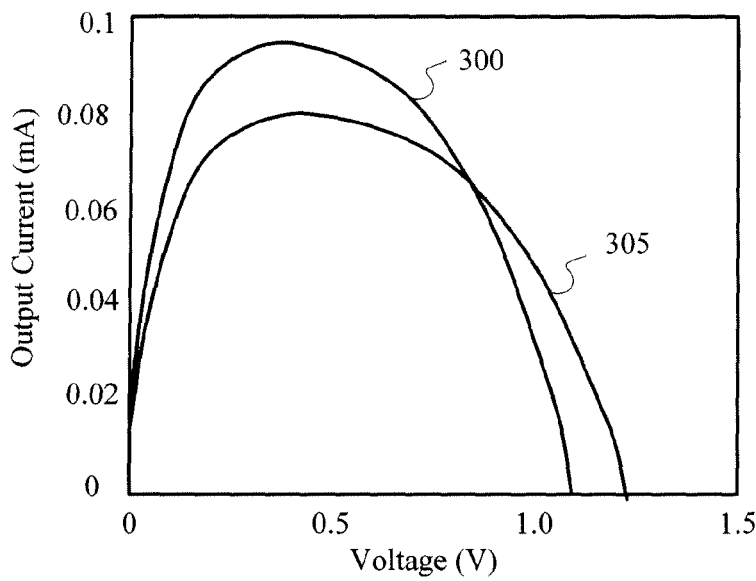
FIG. 3D illustrates how similarly shaped function curves can be represented by one or more base curves.

Advantageously, many I(t), V(t), and I(V) curves have substantially similar half curves. For example, FIG. 3D illustrates I(V) curve 300 and another I(V) curve 305. Advantageously, although having different starting output currents, peak currents, and ending voltages, the half curves comprising each of I(V) curves 300 and 305 could be represented using the same normalized curves because of their shape similarities. An enhanced standard cell library can access a base curve database that includes such normalized curves. Advantageously, as described below, introducing a shared base curve database can dramatically reduce the storage space needed for modeling function curves compared to the conventional way of directly storing the function curves as vectors.

Figure 1:
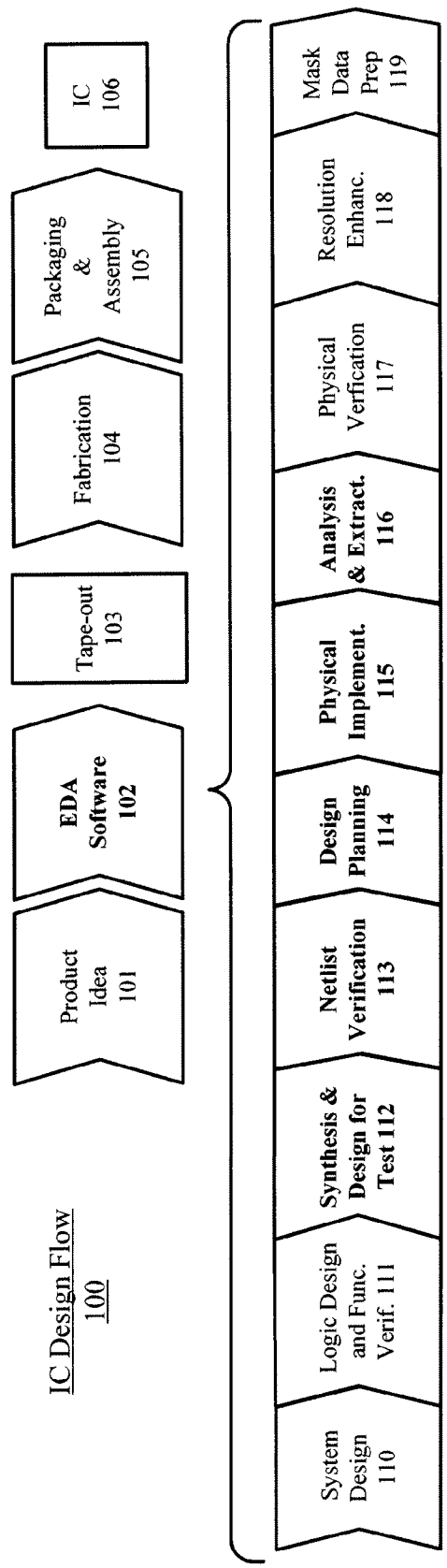
FIG. 1 illustrates a simplified representation of an exemplary digital integrated circuit design flow.
Figure 2A:
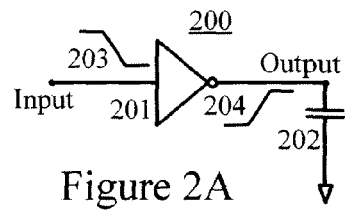
FIG. 2A illustrates an exemplary cell (i.e. an inverter) of a standard cell library.
Figure 2B:
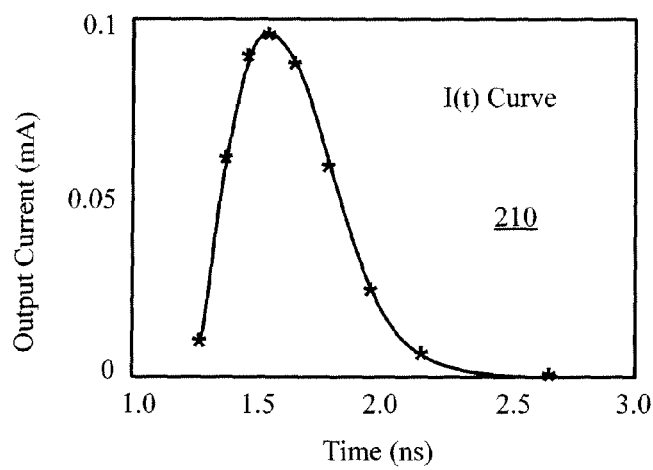
FIG. 2B illustrates an exemplary graph showing the output current of an inverter over time, i.e. an I(t) curve.
Figure 2C:
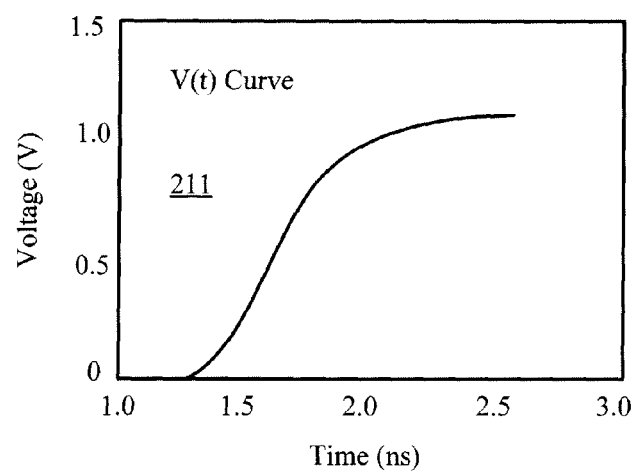
FIG. 2C illustrates an exemplary graph showing the output voltage of an inverter over time, i.e. a V(t) curve.
Figure 2D:
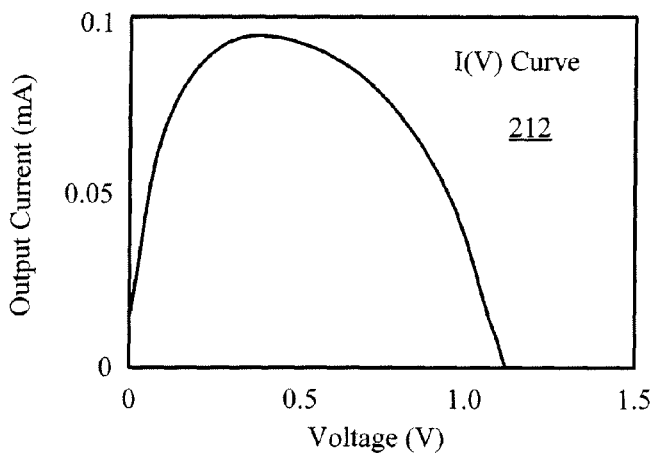
FIG. 2D illustrates an exemplary graph showing the output current of an inverter versus its output voltage, i.e. an I(V) curve.

In one embodiment, to reconstruct an I(V) curve, only 6 parameters are needed: a starting current $I_{start}$, a peak current $I_{peak}$, a peak voltage $V_{peak}$, a peak time $T_{peak}$, a left curve identification, and a right curve identification. For example, referring to FIG. 3A, the starting current $I_{start}$ is 0.02 mA (measured at V=0), the peak current $I_{peak}$ is 0.095 mA, the peak voltage $V_{peak}$ is 0.4 V (i.e. the voltage when $I_{peak}$ occurs), and the peak time $T_{peak}$ is 1.6 ns (see FIG. 2B when output current reaches peak). The peak time $T_{peak}$ can be advantageously used to convert the I(V) curve into an I(t) curve or a V(t) curve. Note that for an I(V) curve, an end voltage is not needed because the end voltage is currently assumed to be power supply voltage VDD (see FIG. 3A), which is a important parameter already stored in a standard cell library.

Figure 3E:
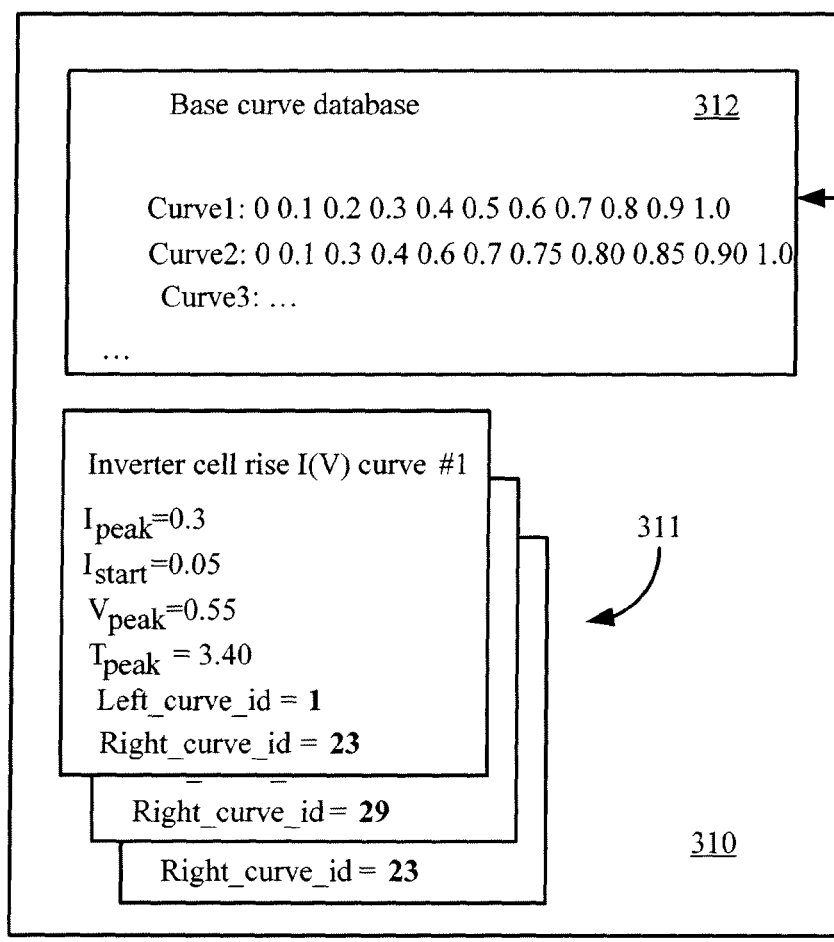
FIG. 3E illustrates an enhanced library including a plurality of function curve data sets and a base curve database.

FIG. 3E illustrates an enhanced standard cell library 310 that includes a plurality of curve data sets 311 and a base curve database 312. Each curve data set includes left base curve identification and right base curve identification. For example, in FIG. 3E, for curve #1 (an inverter cell, rising edge input signal, I(V) curve) the left base curve identification is "1" whereas the right base curve identification is "23". This identification allows one to access the appropriate base (normalized) curves in base curve database 312. In one embodiment, each base curve can be digitized/discretized into multiple points at standardized positions (i.e. 0, 0.1, 0.2, ... 1.0) on the x-axis to ensure an efficient reconstruction of each half curve. Thus, in this embodiment, the values stored in base curve database 312 can represent the y-axis positions of the points.

Figure 4:
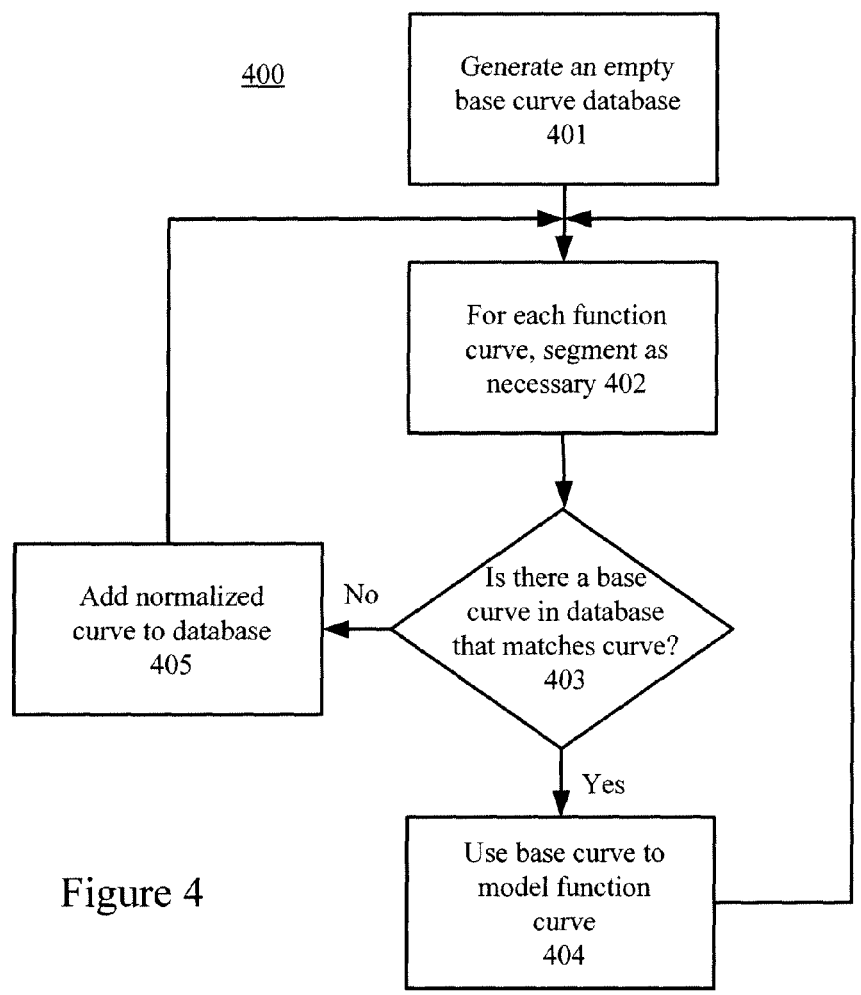
FIG. 4 illustrates a method of creating and using a base curve database.

FIG. 4 illustrates a method 400 of generating and using a base curve database. In method 400, a step 401 can generate an empty base curve database. For each function curve, step 402 segments that function curve into one or more curves. (Note that although FIG. 3A describes a function curve being segmented into two half curves, one or more segments may comprise a function curve.) Step 403 determines if there is a base curve in the database that matches each curve. Note that to match, the curve can be normalized and then compared to the base curve, which are usually normalized. If the newly normalized curve does not match a base curve, then step 405 can add that normalized curve to the database as a base curve. If there is a base curve in the database that matches the curve currently being analyzed, then step 404 can use that base curve to model the curve. Following either step 404 or step 405, the process can return to step 402.

The base curve database technique can significantly decrease the storage space for a library. For example, instead of requiring 1-4 million curves directly stored in a typical CCS library as vectors, the enhanced standard cell library may only need 10,000-100,000 base curves. Note that although the number of function curves in the library remains the same, a function curve in a typical CCS library can require 14-20 floating point numbers whereas only a few parameters and at least one curve identification are needed with the help of the base curve database. (Note that in some embodiments where a single base curve can be used to model the function curve, only one curve identification is needed.) As a result, the base curve database technique can significantly reduce the storage space of current-source-model-based library by 3-5×.

A smaller library means that the EDA tool can load that library faster with less memory, thereby advantageously reducing the memory and CPU time usage of the EDA tool. Of importance, once created, a base curve database can be shared by a plurality of libraries (see FIG. 3E, e.g. libraries 310 and 313 can share base curve database 312), thereby further increasing its effectiveness.

Figure 5:
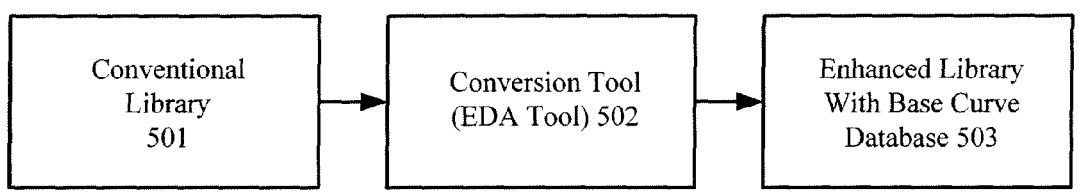
FIG. 5 illustrates how a conventional library can be converted into an enhanced library with a base curve database.

In one embodiment shown in FIG. 5, a conversion tool 502 can access a conventional library 501 and convert the tables of vectors in that library to an enhanced library 503 including a base curve database. This conversion can be done by splitting any curves into segments (for example, the two half curves as shown in FIG. 3A) and then using the technique described in reference to FIG. 4. Once enhanced library 503 is created, the EDA tool can delete conventional library 501, thereby reducing the memory usage of the EDA tools. Additional entries to enhanced library 503 can be made at any subsequent time by following steps 402-405 in FIG. 4. In one embodiment, the EDA tool can include conversion tool 502.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, although two base curves can be used to model an I(V) curve, other curves (related to standard cell timing, power, and other functionalities) can be modeled using one or more base curves. Accordingly, it is intended that the scope of the invention be defined by the following Claims and their equivalents.

The invention claimed is:

1. A method of reconstructing a function curve using a base curve database, the function curve graphically representing a functioning of an object measured using two parameters, the base curve database storing normalized curves, each normalized curve having a height and a width equal to one, the method comprising:
   determining a first identification (ID) of a first curve segment associated with the function curve;
   determining a second ID of a second curve segment associated with the function curve;
   accessing first and second normalized curves in the base curve database using the first and second IDs, respectively; and
   using a computer, using characteristic parameters of the function curve as well as the first and second normalized curves to reconstruct at least a portion of the function curve, wherein a reduced storage representation of the portion of the function curve consists of the first ID, the second ID, and the characteristic parameters, wherein the characteristic parameters include at least one of a starting current, a peak current, a peak voltage, and a peak time.

2. The method of claim 1, wherein the first curve segment is a first half of the function curve and the second curve segment is a second half of the function curve.

3. The method of claim 1, wherein the first and second curve segments form a total function curve.

4. The method of claim 1, wherein the peak time is used to convert an I(V) curve into an I(t) curve or a V(t) curve.

5. The method of claim 1, wherein accessing first and second normalized curves includes referring to one of a plurality of curve data sets.

6. The method of claim 5, wherein the one of the plurality of curve data sets identifies the first and second normalized curves.

7. The method of claim 6, wherein the first and second normalized curves are accessed from a base curve database.

8. The method of claim 7, wherein the first and second normalized curves are digitized/discretized into multiple points at standardized positions on an x-axis.

9. The method of claim 8, wherein values stored in the base curve database represent y-axis positions of the multiple points.

10. The method of claim 7, wherein the base curve database is shared by a plurality of libraries.

* * * * *

UNITED STATES PATENT AND TRADEMARK OFFICE
CERTIFICATE OF CORRECTION

PATENT NO. : 8,069,424 B2  
APPLICATION NO. : 12/212606  
DATED : November 29, 2011  
INVENTOR(S) : Xin Wang et al.

Page 1 of 1

It is certified that error appears in the above-identified patent and that said Letters Patent is hereby corrected as shown below:

In the Claims

<u>Column 10</u>  
Line 8, insert --the-- before "accessing".  
Line 15, replace "a" with --the--.

Signed and Sealed this  
Third Day of September, 2013

Teresa Stanek Rea  
*Acting Director of the United States Patent and Trademark Office*